(12) United States Patent
Wang et al.

(10) Patent No.: US 12,310,030 B2
(45) Date of Patent: May 20, 2025

(54) SEMICONDUCTOR STRUCTURE AND MANUFACTURING METHOD THEREOF

(71) Applicants: CHANGXIN MEMORY TECHNOLOGIES, INC., Hefei (CN); BEIJING SUPERSTRING ACADEMY OF MEMORY TECHNOLOGY, Beijing (CN)

(72) Inventors: Xiaoguang Wang, Hefei (CN); Dinggui Zeng, Hefei (CN); Huihui Li, Hefei (CN); Kanyu Cao, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 364 days.

(21) Appl. No.: 17/808,372

(22) Filed: Jun. 23, 2022

(65) Prior Publication Data

US 2023/0066016 A1   Mar. 2, 2023

Related U.S. Application Data

(63) Continuation of application No. PCT/CN2022/077805, filed on Feb. 25, 2022.

(30) Foreign Application Priority Data

Sep. 1, 2021   (CN) .................. 202111020494.6

(51) Int. Cl.
*H10B 61/00* (2023.01)
*H10N 50/01* (2023.01)

(52) U.S. Cl.
CPC ............ *H10B 61/22* (2023.02); *H10N 50/01* (2023.02)

(58) Field of Classification Search
CPC .............. H01L 29/42392; H10B 61/22; H10D 30/6735
See application file for complete search history.

(56) References Cited

U.S. PATENT DOCUMENTS

| 8,830,735 B2 | 9/2014 | Kariyada et al. |
| 9,117,749 B1 | 8/2015 | Or-Bach et al. |
| (Continued) |

FOREIGN PATENT DOCUMENTS

| CN | 102479541 A | 5/2012 |
| CN | 109461756 A | 3/2019 |
| (Continued) |

OTHER PUBLICATIONS

International Search Report cited in PCT/CN2022/077806 mailed May 19, 2022, 9 pages.

(Continued)

*Primary Examiner* — Shih Tsun A Chou
(74) *Attorney, Agent, or Firm* — Kilpatrick Townsend & Stockton LLP

(57) ABSTRACT

The present disclosure provides a semiconductor structure and a manufacturing method thereof. The semiconductor structure includes: a plurality of memory cells alternately arranged on a substrate, the memory cell including an odd number of vertical transistors, a connection pad connected to one end of each of the odd number of vertical transistors, and a magnetic tunnel junction located on the connection pad; wherein a material of a channel of the vertical transistor includes a monocrystalline semiconductor.

12 Claims, 5 Drawing Sheets

(56) References Cited

U.S. PATENT DOCUMENTS

| | | |
|---|---|---|
| 10,297,290 B1 | 5/2019 | Beigel et al. |
| 10,446,606 B2 | 10/2019 | Kumar et al. |
| 11,127,783 B2 | 9/2021 | Zhu et al. |
| 2007/0080385 A1 | 4/2007 | Kim et al. |
| 2010/0059837 A1 | 3/2010 | Kim et al. |
| 2010/0289084 A1 | 11/2010 | Yoon et al. |
| 2011/0215382 A1 | 9/2011 | Asao et al. |
| 2014/0138609 A1 | 5/2014 | Satoh et al. |
| 2016/0043136 A1 | 2/2016 | Kim et al. |
| 2020/0058798 A1* | 2/2020 | Pillarisetty ......... H01L 29/4232 |
| 2020/0144330 A1 | 5/2020 | Majhi et al. |
| 2022/0052115 A1* | 2/2022 | Wang .................... H10B 63/80 |

FOREIGN PATENT DOCUMENTS

| | | |
|---|---|---|
| CN | 110571261 A | 12/2019 |
| CN | 110892531 A | 3/2020 |
| CN | 111816673 A | 10/2020 |
| CN | 212136451 U | 12/2020 |
| CN | 212391999 U | 1/2021 |
| CN | 112349322 A | 2/2021 |
| WO | 2017052542 A1 | 3/2017 |
| WO | 2018182724 A1 | 10/2018 |

OTHER PUBLICATIONS

International Search Report cited in PCT/CN2022/077730 mailed Apr. 25, 2022, 9 pages.

International Search Report cited in PCT/CN2022/077805 mailed May 11, 2022, 8 pages.

\* cited by examiner

SEMICONDUCTOR STRUCTURE AND MANUFACTURING METHOD THEREOF

CROSS-REFERENCE TO RELATED APPLICATIONS

This is a continuation of International Application No. PCT/CN2022/077805, filed on Feb. 25, 2022, which claims the priority to Chinese Patent Application No. 202111020494.6, titled "SEMICONDUCTOR STRUCTURE AND MANUFACTURING METHOD THEREOF" and filed with China National Intellectual Property Administration (CNIPA) on Sep. 1, 2021. The entire contents of International Application No. PCT/CN2022/077805 and Chinese Patent Application No. 202111020494.6 are incorporated herein by reference.

TECHNICAL FIELD

The present disclosure relates to the technical field of semiconductors, and in particular, to a semiconductor structure and a manufacturing method thereof.

BACKGROUND

A magnetoresistive random access memory (MRAM) has the high read and write capability of a static random access memory (SRAM) and the high integration degree of a dynamic random access memory (DRAM), and allows repeated write of data.

At present, a magnetic tunnel junction (MTJ) is combined with a transistor to increase the capacity of an MRAM, so that the capacity of the MRAM is increased from the MB level to the GB level. However, a drive current of a transistor is small. As a result, it is difficult for a transistor to drive an MRAM memory array.

SUMMARY

An embodiment of the present disclosure provides a semiconductor structure, including:
  a plurality of memory cells alternately arranged on a substrate, the memory cell including an odd number of vertical transistors, a connection pad connected to one end of each of the odd number of vertical transistors, and a magnetic tunnel junction on the connection pad; wherein
  a material of a channel of the vertical transistor includes a monocrystalline semiconductor.

Another embodiment of the present disclosure provides a method of manufacturing a semiconductor structure, including:
  providing a substrate, and forming a plurality of vertical transistors on the substrate; wherein a material of a channel of the vertical transistor includes a monocrystalline semiconductor;
  forming a plurality of connection pads on a side of the plurality of vertical transistors away from the substrate, so that a projection of the connection pad on the substrate overlaps projections of an odd number of the vertical transistors on the substrate; and
  forming a magnetic tunnel junction on one side of each of the connection pads away from the vertical transistor.

BRIEF DESCRIPTION OF THE DRAWINGS

The accompanying drawings incorporated into the specification and constituting part of the specification illustrate the embodiments of the present disclosure, and serve, together with the specification, to explain the principles of the present disclosure.

Specific embodiments of the present disclosure are shown by using the accompanying drawings and are described below in more detail. The accompanying drawings and text description are not intended to limit the scope of the concept of the present disclosure in any manner, but to explain the concept of the present disclosure for those skilled in the art with reference to specific embodiments.

DETAILED DESCRIPTION

Exemplary embodiments are described in detail herein, and examples thereof are represented in the accompanying drawings. When the following descriptions are relate to the accompanying drawings, unless otherwise stated, same digitals in different accompanying drawings represent same or similar essential factors. Implementations described in the following exemplary embodiments do not represent all implementations consistent with the present disclosure. On the contrary, the implementations are merely examples of apparatuses and methods that are described in detail in the appended claims and consistent with some aspects of the present disclosure.

Figure 1:
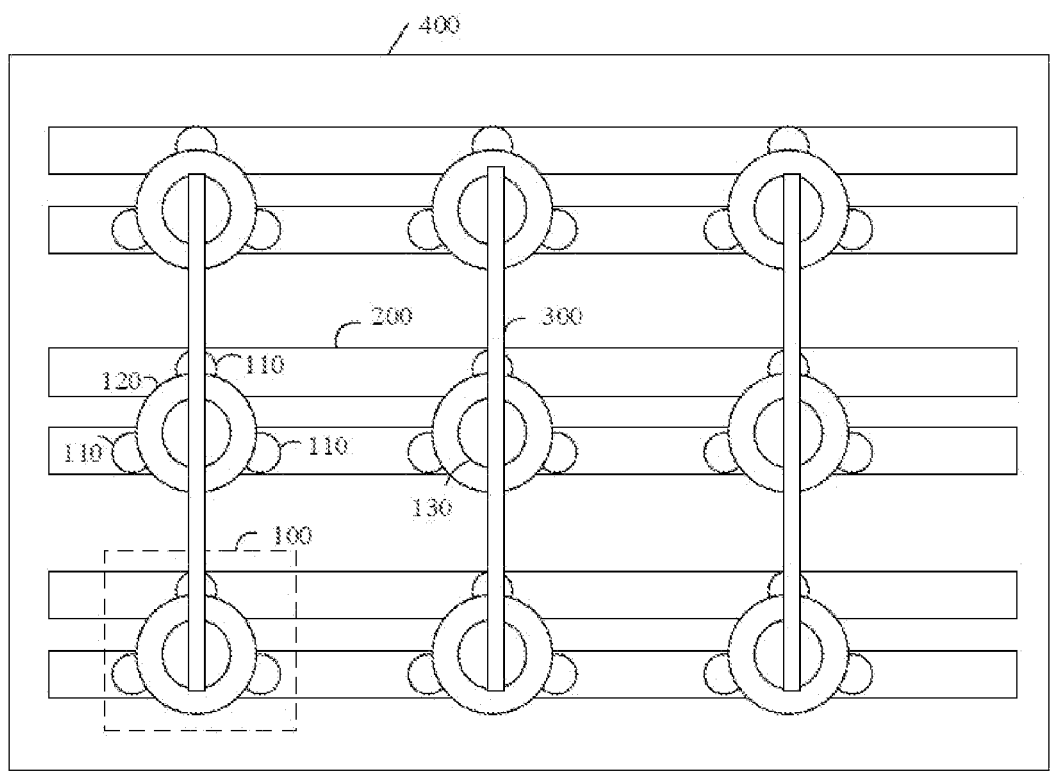
FIG. 1 is a top view of a semiconductor structure according to an embodiment of the present disclosure.
Figure 2:
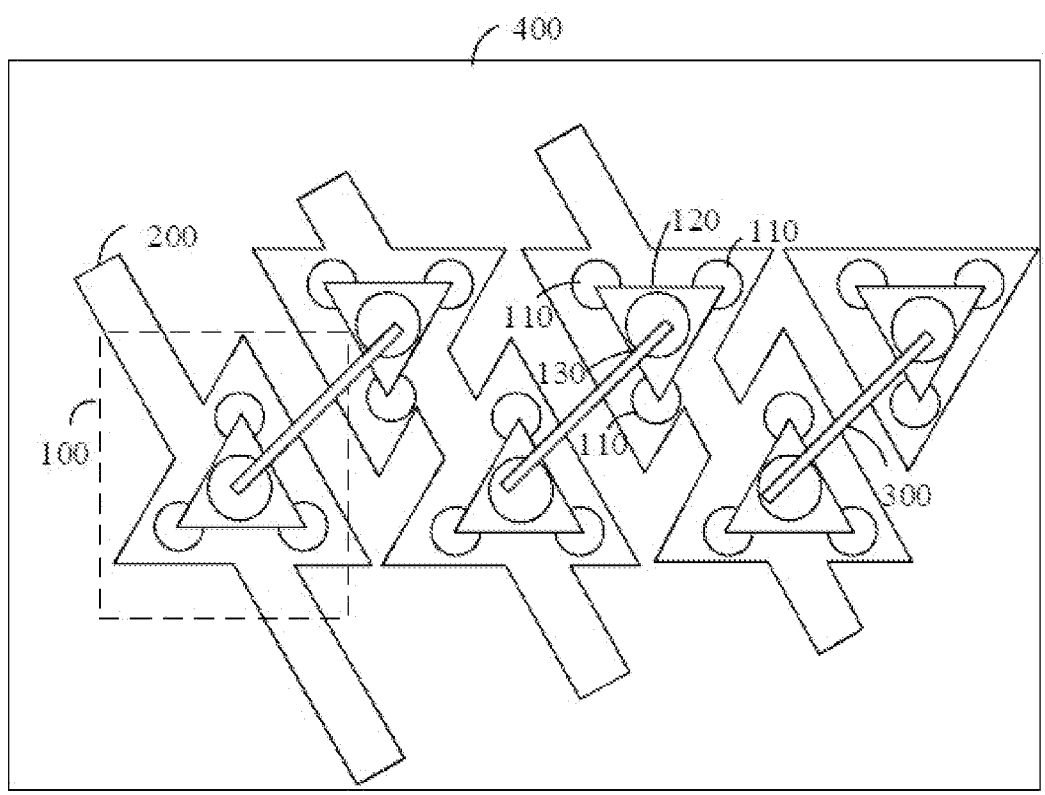
FIG. 2 is a top view of a semiconductor structure according to another embodiment of the present disclosure.
Figure 3:
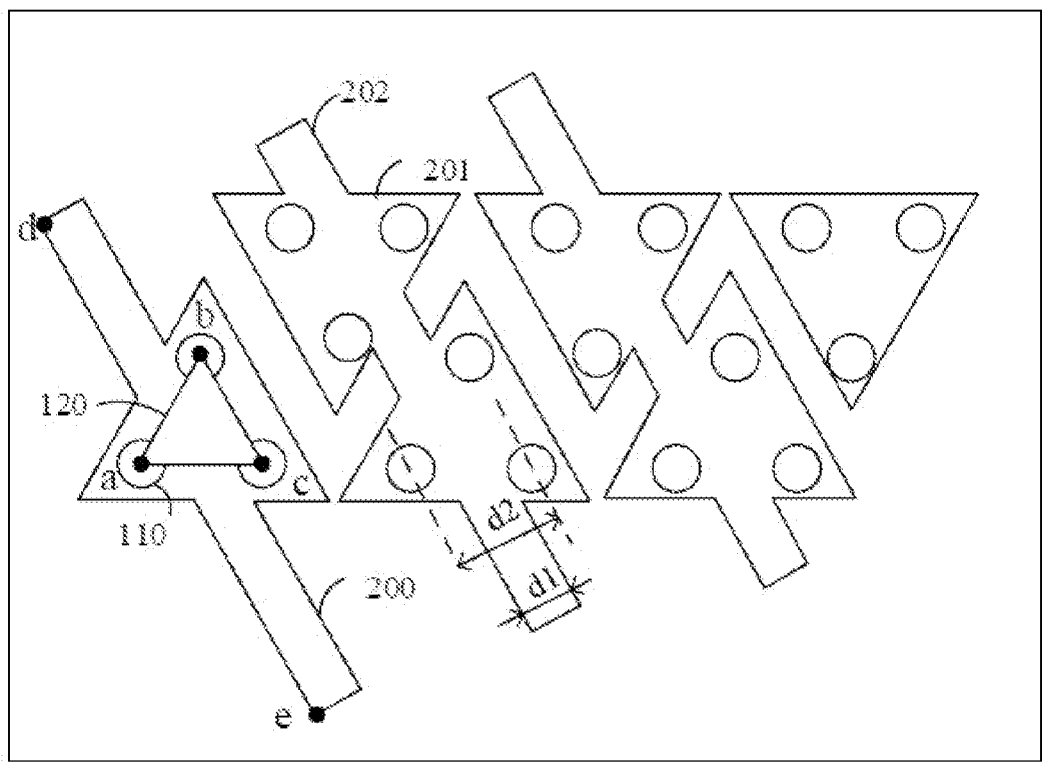
FIG. 3 is a positional relationship diagram of word lines, vertical transistors, and connection pads according to the embodiment shown in FIG. 2.

As shown in FIG. 1 to FIG. 3, an embodiment of the present disclosure provides a semiconductor structure, including a substrate 400 and a plurality of memory cells disposed on the substrate 400.

In this embodiment of the present disclosure, the substrate 400 is a semiconductor substrate, for example, may be a Si substrate, a Ge substrate, a SiGe substrate, a silicon on insulator (SOI) substrate, or a germanium on insulator (GOI) substrate. In other embodiments, the semiconductor substrate may also include a semiconductor substrate of other elements or a compound semiconductor substrate, for example, GaAs, InP, or SiC. The semiconductor substrate may also be a laminated structure, for example, Si/SiGe. The semiconductor substrate may also be another epitaxial structure, for example, silicon germanium on insulator (SGOI). In this embodiment, the substrate 400 may be a monocrystalline silicon substrate, configured to support a device structure thereon.

The plurality of memory cells are alternately arranged on the substrate 400. The plurality of memory cells may be alternately arranged as follows: two adjacent rows or two adjacent columns of memory cells are arranged in a staggered manner, as shown in FIG. 2, or two adjacent rows or two adjacent columns of memory cells are arranged opposite to each other, as shown in FIG. 1.

The memory cell includes an odd number of vertical transistors 110, a connection pad 120, and a magnetic tunnel junction 130. That is, each memory cell may include 3 vertical transistors 110, 5 vertical transistors 110, . . . , or 2n−1 vertical transistors 110, wherein n is a positive integer.

The connection pad 120 is connected to one end of each of the odd number of vertical transistors 110, and one magnetic tunnel junction 130 is located on one connection pad 120, so that the odd number of vertical transistors 110 are connected to one magnetic tunnel junction 130 through the connection pad 120.

Figure 4:
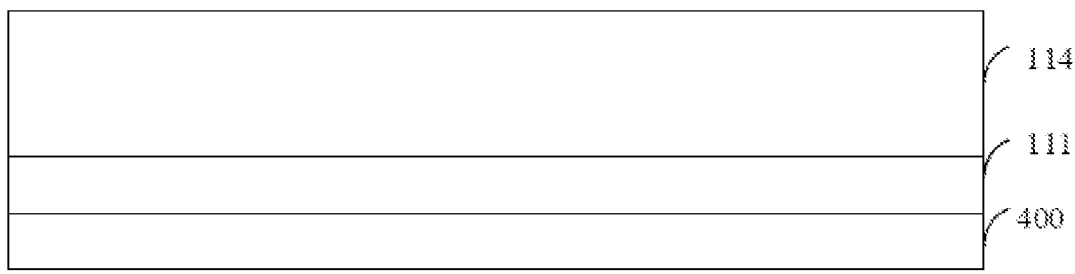
FIG. 4 and FIG. 5 are diagrams of a process for manufacturing a channel of a vertical transistor according to an embodiment of the present disclosure.

The vertical transistor includes a source electrode, a drain electrode, a gate electrode, and a channel. The plurality of vertical transistors may share a source plate 111 to simplify the manufacturing process. Specifically, as shown in FIG. 4, the source plate 111 is formed on the substrate 400, and the source plate 111 is a source electrode of each vertical transistor. A material of the source plate 111 may be indium tin oxide (ITO), molybdenum (Mo), aluminum (Al), titanium aluminum alloy (Ti/Al), or the like.

A plurality of channels 112 are formed on the source plate 111, and a plurality of word lines 200 are formed at intervals on the periphery of the channels 112. An isolation layer 501 is further arranged between the source plate 111 and the word line 200. The isolation layer 501 is configured to isolate the source plate 111 from the word line 200. A material of the isolation layer 501 may be silicon oxide. A material of the channel 112 may include a monocrystalline semiconductor, and the monocrystalline semiconductor may be, for example, monocrystalline silicon or monocrystalline germanium, so as to improve the conductivity of the vertical transistor. In this way, the vertical transistor 110 may provide a larger write current and improve the drive capability of the memory cell. A drain electrode is formed on each channel 112. A channel 112, a word line 200 where the channel 112 is located, the source plate 111, and the drain electrode of the channel 112 form a vertical transistor, and the word line 200 where the channel is located is a gate electrode of the vertical transistor.

An end of the channel 112 in contact with the source plate 111 is called a bottom end of the channel 112, and an end opposite to the bottom end is called a top end of the channel 112. The drain electrode of the vertical transistor is formed at the top end of the channel 112. A dielectric layer 113 is formed between the channel 112 and the word line 200. A material of the dielectric layer 113 includes a high-k oxide such as hafnium dioxide ($HfO_2$), zirconium dioxide ($ZrO_2$), or hafnium oxynitride (HfON).

One connection pad 120 is formed on the odd number of vertical transistors 110, so that one end of each of the odd number of vertical transistors 110 is connected to one connection pad 120. One magnetic tunnel junction 130 is formed on each connection pad 120, so that the odd number of vertical transistors 110 are connected to one magnetic tunnel junction 130 through the connection pad 120.

In an embodiment, referring to FIG. 3, the connection pad 120 is connected to one end of each of the three vertical transistors 110. A cross section of the vertical transistor 110 along a direction of a surface of the substrate 400 is a circle, a cross section of the connection pad 120 along the direction of the surface of the substrate 400 is a triangle, and each vertex of the triangle is respectively located at a center of the circular cross section. That is, a vertex a of the triangle is located at the center of the circular cross section of a first vertical transistor 110, a vertex b of the triangle is located at the center of the circular cross section of a second vertical transistor 110, and a vertex c of the triangle is located at the center of the circular cross section of a third vertical transistor 110, so that the connection pad 120 is connected to the three vertical transistors 110. A projection of the magnetic tunnel junction 130 on the substrate 400 is located within a projection of the connection pad 120 on the substrate 400, so that one magnetic tunnel junction 130 is connected to one connection pad 120.

The projection of the connection pad 120 on the substrate 400 is a triangle and the centers of the circular cross sections of the three vertical transistors 110 are located at the three vertices of the triangle, so that an area of the triangular connection pad 120 is larger, and an area of the magnetic tunnel junction 130 on the connection pad 120 on the substrate 400 may also be larger.

In an embodiment, the vertical transistors 110 in two adjacent rows of the memory cells are located in three consecutive rows of the array structure. That is, three consecutive rows in the array of the vertical transistors 110 are sequentially marked as an $(i-1)^{th}$ row, an $i^{th}$ row, and an $(i+1)^{th}$ row. Two consecutive rows in the memory cell array are sequentially marked as a $(j-1)^{th}$ row and a $j^{th}$ row. The vertical transistors 110 in the $(j-1)^{th}$ row of memory cells are located in the $(i-1)^{th}$ row and the $i^{th}$ row in the array of the vertical transistors 110, and the vertical transistors 110 in the $j^{th}$ row of memory cells are located in the $i^{th}$ row and the $(i+1)^{th}$ row in the array of the vertical transistors 110. In this arrangement, the pattern layout of the semiconductor is more uniform, which is beneficial to the manufacturing of the semiconductor.

In an embodiment, the semiconductor structure further includes a plurality of word lines 200, the plurality of word lines 200 are arranged at intervals, and an extension direction of the word line 200 is the same as a direction of a side of the triangle. As shown in FIG. 3, the extension direction of the word line 200 is along a straight line passing through a point d and a point e, the projection of the connection pad 120 on the substrate 400 is a triangle abc, and the straight line passing through the point d and the point e is in parallel with a straight line passing through a point b and a point c. In this arrangement, a distance between two adjacent word lines 200 is larger, and the patterning process of the word line 200 can be simplified.

In an embodiment, the word line 200 includes a gate electrode portion 201 and a conducting wire portion 202. The gate electrode portion 201 surrounds a channel of each of the vertical transistors 110 of the memory cell. The conducting wire portion 202 connects a plurality of the gate electrode portions 201. A projection of the gate electrode portion 201 on the surface of the substrate coincides with a projection of the connection pad 120 on the surface of the substrate 400. That is, when the projection of the gate electrode portion is a triangle, the projection of the connection pad 120 is also a triangle, and the two triangles have the same size. Besides, the gate electrode portion is located directly below the connection pad 120.

In an embodiment, the gate electrode portion 201 and the conducting wire portion 202 are formed in a same etching step. In this arrangement, the connection between the gate electrode portion and the conducting wire portion 202 may be implemented through one-step etching without producing connection holes.

In an embodiment, a width d1 of a portion of the word line 200 (e.g., the conducting wire portion 202) is smaller than a distance d2 between the vertical transistors 110. In this arrangement, a distance between two word lines 200 is larger, which can simplify the patterning process of the word lines 200.

The magnetic tunnel junction 130 is formed on the connection pad 120, and the magnetic tunnel junction 130 includes a pinned layer, an insulating layer, and a free layer that are stacked in sequence. A magnetization direction of the pinned layer is fixed, while a magnetization direction of the free layer is easily changed under the action of a magnetic field or a spin-polarized current. The insulating layer is configured to isolate the pinned layer from the free layer. Materials of the pinned layer and the free layer may be the same or different, for example, may be iron (Fe), cobalt (Co), nickel (Ni), or alloys thereof. Thicknesses of the pinned layer and the free layer may be the same or different, sizes of the pinned layer and the free layer may be the same or different, and shapes of the pinned layer and the free layer may be the same or different, for example, may be cylindrical or square columnar.

When a current flows from the pinned layer into the free layer, the magnetization direction of the free layer is in parallel with that of the pinned layer, a resistance of the magnetic tunnel junction is small, and the memory cell completes writing data "0". When a current flows from the free layer into the pinned layer, the magnetization direction of the free layer is in parallel with that of the pinned layer in a reverse direction, a resistance of the magnetic tunnel junction is large, and the memory cell completes writing data "1".

A plurality of bit lines 300 may also be formed on the magnetic tunnel junction 130 to alleviate the problem of a high resistance of buried bit lines. The extension direction of the word line 200 is referred to as a first direction, and the extension direction of the bit line 300 is referred to as a second direction. In this case, a plurality of bit lines 300 extending in the second direction are formed on the magnetic tunnel junction 130, each bit line 300 may be connected to a plurality of magnetic tunnel junctions 130, and the first direction and the second direction may be perpendicular to each other. Then, a current is generated to generate a magnetic field by applying a voltage to the word line 200 and the bit line 300, so that the magnetization direction of the free layer is changed, so as to implement read and write of the magnetoresistive random access memory.

In the semiconductor structure provided by the present disclosure, a memory cell in which an odd number of vertical transistors 110 drive one magnetic tunnel junction 130 has a higher drive capability. A material of a channel of the vertical transistor 110 includes a monocrystalline semiconductor, and the conductivity of the vertical transistor 110 is higher, so as to improve the drive capability of the vertical transistor 110 and further improve the drive capability of the memory cell.

Another embodiment of the present disclosure provides a method of manufacturing a semiconductor structure, including:

S51: Provide a substrate 400, and form a plurality of vertical transistors 110 on the substrate 400.

Figure 5:
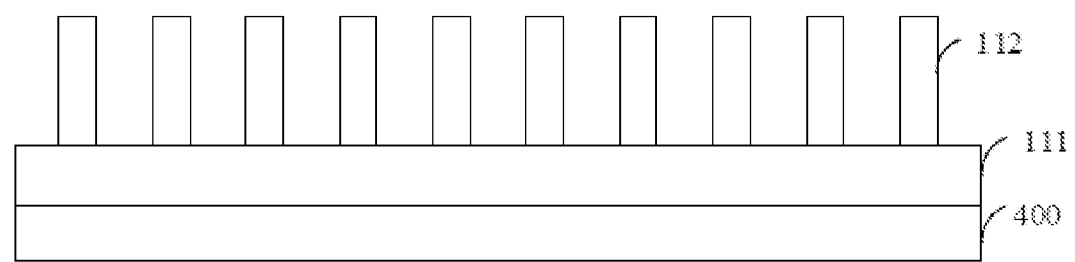
Figure 6:
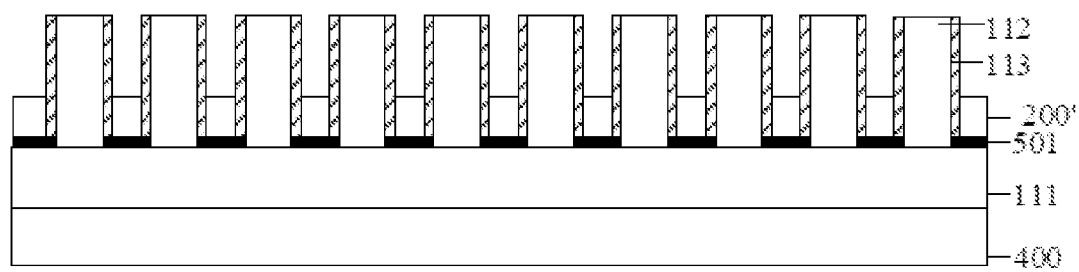
FIG. 6 and FIG. 7 are diagrams of a process for manufacturing a word line according to an embodiment of the present disclosure.

The substrate 400 is a semiconductor substrate, and a source plate 111 is formed on the substrate 400, as shown in FIG. 4. Specifically, a conductive material is deposited on the substrate 400 through atomic layer deposition or chemical vapor deposition, for example, may be indium tin oxide (ITO), molybdenum (Mo), aluminum (Al), or titanium aluminum alloy (Ti/Al). A planarization process is performed on the deposited conductive material to form the source plate 111 on the substrate 400. Referring to FIG. 4 and FIG. 5, a monocrystalline semiconductor material, such as monocrystalline silicon and monocrystalline germanium, is deposited on the source plate 111, and a planarization process is performed on the deposited semiconductor material to form a channel layer on an isolation layer. The channel layer is etched to form a plurality of vertical channels 112. Referring to FIG. 6, a high-k dielectric layer 113 such as hafnium dioxide ($HfO_2$), zirconium dioxide ($ZrO_2$), or hafnium oxynitride (HfON) is formed outside the channel 112.

Then, still referring to FIG. 6, a dielectric material such as silicon oxide or silicon nitride is deposited on the source plate 111, and a planarization process is performed on the deposited dielectric material to form an isolation layer 501 on the source plate 111. Then, word lines 200 arranged at intervals are formed on the isolation layer 501. First, a metal material such as tungsten (W) or molybdenum (Mo) is deposited on the isolation layer 501, and a planarization process is performed on the metal material to form a word line plate 200' on the isolation layer 501.

Figure 7:
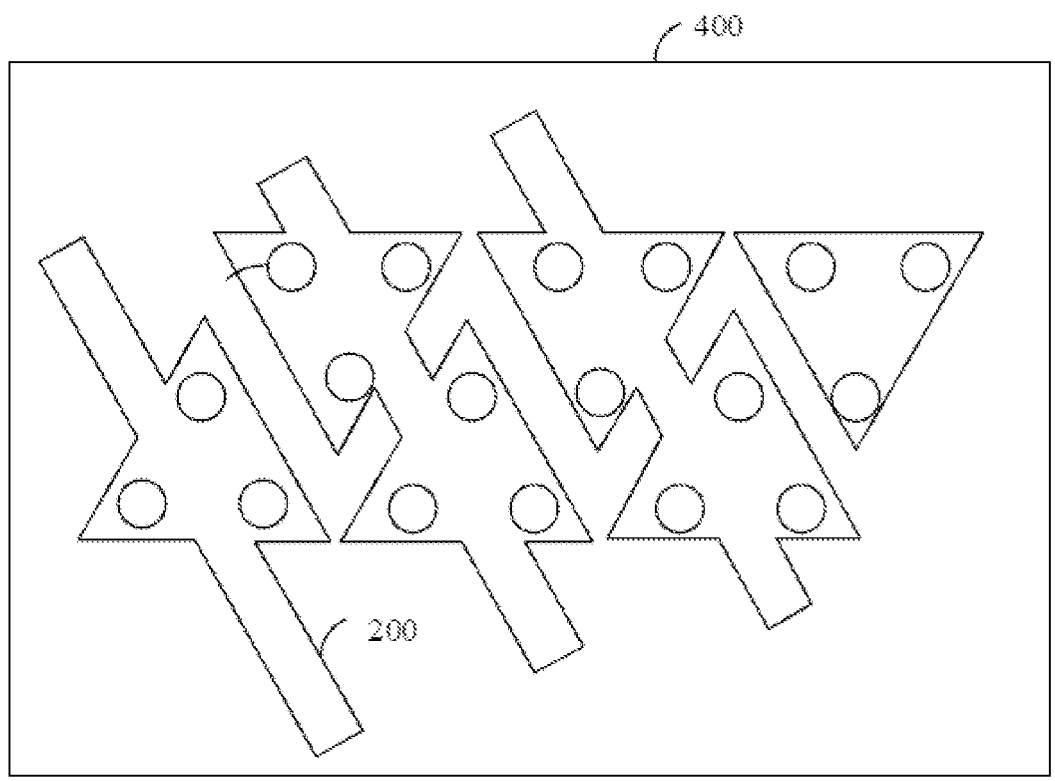
Figure 8:
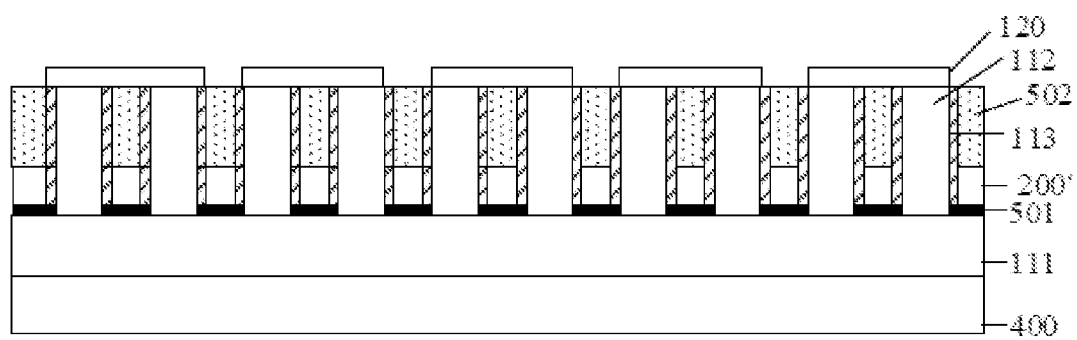
FIG. 8, FIG. 9, and FIG. 10 are diagrams of a process for manufacturing a word line according to an embodiment of the present disclosure.
Figure 9:
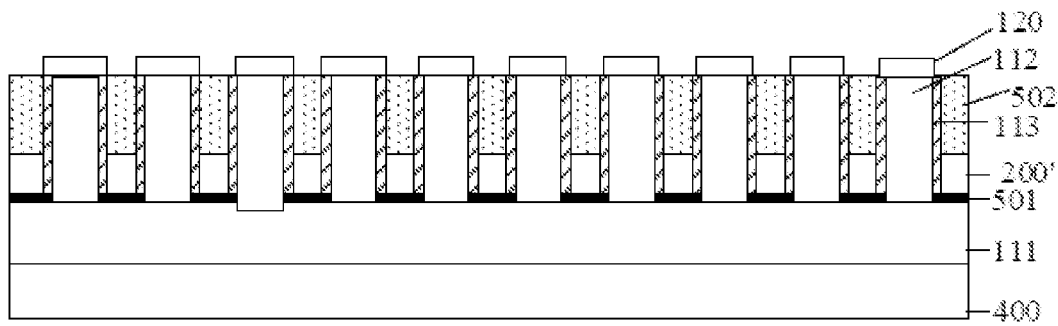

A plurality of triangular mask patterns are formed on a gate plate, and make projections of three vertical channels on the triangular mask pattern within the triangular mask pattern. A plurality of strip-shaped mask patterns are formed on the gate plate, and make the strip-shaped mask pattern and the triangular mask pattern overlap with each other. The gate plate is etched to form word lines with the mask patterns as covering, to obtain structures shown in FIG. 7 to FIG. 9. FIG. 7 is a top view of the word lines. FIG. 8 is a cross-sectional view of a position of an $i^{th}$ row of vertical transistors. FIG. 9 is a cross-sectional view of a position of an $(i+1)^{th}$ row of vertical transistors.

When patterning on the gate plate, a conventional patterning process may be used, or the more precise self-aligned double patterning (SADP) technology or self-aligned quadruple patterning (SAQP) technology may be used.

Then, a dielectric material is deposited on the surface of the word line 200 to form a covering layer 502 to protect the word line 200. Then, a drain electrode is formed on the channel 112, and each channel 112 has a corresponding drain electrode. A method for forming the drain electrode may be: removing a part of monocrystalline semiconductor material at the top of the channel 112 to form a groove in the channel 112, and filling the groove with a conductive material to form a drain electrode. A method for forming a drain electrode may also be: depositing a conductive material on the channel 112 and the covering layer 502, and then removing the conductive material on the covering layer 502 to form a drain electrode on the channel 112.

S52: Form a plurality of connection pads 120 on a side of the plurality of vertical transistors 110 away from the substrate 400, so that a projection of the connection pad 120 on the substrate 400 overlaps projections of an odd number of the vertical transistors 110 on the substrate 400.

Figure 10:
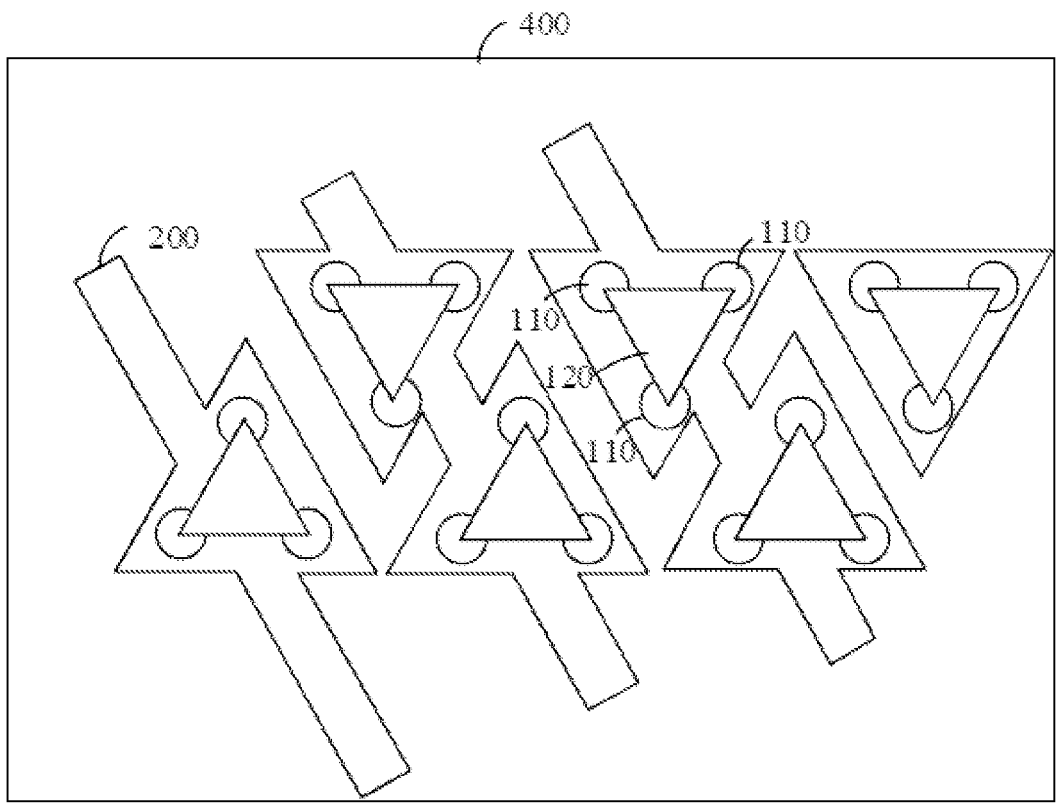

A metal layer is formed on a side of the plurality of vertical transistors 110 away from the substrate 400, and a mask pattern is formed on the metal layer. Projections of the odd number of vertical transistors 110 on the mask pattern are located within the mask pattern. The metal layer is etched with the mask pattern as covering to obtain the connection pad 120, as shown in FIG. 10, so as to implement connection between the drain electrodes of the odd number of vertical transistors 110 and the connection pad 120.

S53: Form a magnetic tunnel junction 130 on one side of each of the connection pads 120 away from the vertical transistor 110.

A dielectric material such as oxide is deposited on the connection pad 120 and the covering layer 502 to form a dielectric layer 503 covering the connection pad 120, and then a pinned layer 131, an insulating layer 132, and a free layer 133 are formed on the dielectric layer 503 in sequence. The pinned layer 131 is in contact with the upper position of the connection pad 120. An end of the pinned layer 131 in contact with the connection pad 120 is referred to as the upper position of the connection pad 120 herein.

Specifically, two directions in parallel with the substrate 400 are referred to as an X direction and a Y direction respectively, and a pinned layer plate, an insulating layer plate, and a free layer plate are formed on the dielectric layer 503 in sequence. Patterning processing is performed on the pinned layer plate, the insulating layer plate, and the free layer plate in the X direction and the Y direction to obtain the pinned layer 131, the insulating layer 132, and the free layer 133 that are stacked in sequence.

For example, a third photoresist layer is formed on the free layer plate, and the third photoresist layer includes a plurality of strip-shaped structures arranged at intervals in the X direction. A third mask layer is formed on a sidewall of the third photoresist layer, and the third photoresist layer is removed. The free layer plate, the insulating layer plate, and the pinned layer plate are etched to reach the connection pad 120 with the third mask layer as covering, so that the free layer plate, the insulating layer plate, and the pinned layer plate include a plurality of strip-shaped structures in the X direction. The strip-shaped structures extend in the Y direction. The third mask layer is removed, and then a fourth photoresist layer is formed on each of the plurality of strip-shaped structures. The fourth photoresist layer includes a plurality of strip-shaped structures in the Y direction, and a size of the strip-shaped structure in the X direction is the same as that of the third mask layer in the X direction. A fourth mask layer is formed on a sidewall of the fourth photoresist layer, and the third photoresist layer is removed. The free layer plate, the insulating layer plate, and the pinned layer plate are etched to reach the connection pad 120 with the fourth mask layer as covering, to form a magnetic tunnel junction on each connection pad 120, that is, the pinned layer 131, the insulating layer 132, and the free layer 133 that are stacked in sequence, as shown in FIG. 11.

Figure 11:
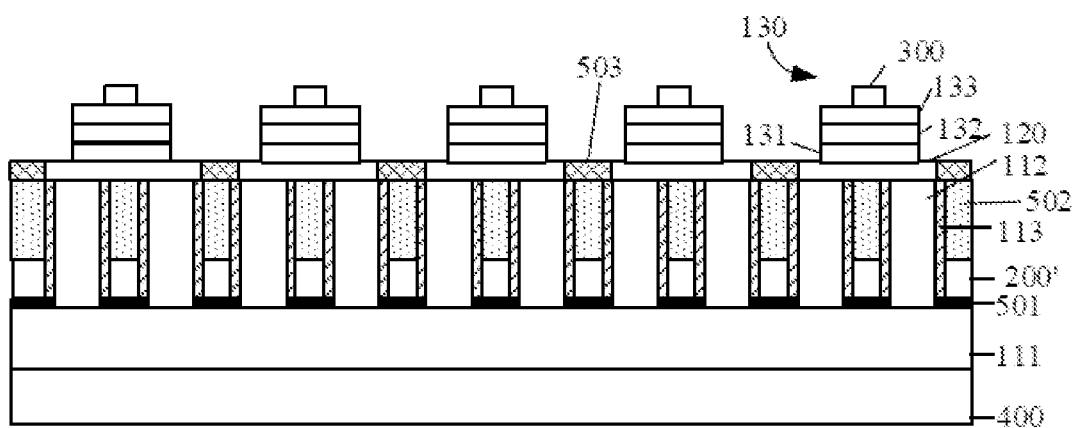
FIG. 11 is a diagram of a process for manufacturing a connection pad, a magnetic tunnel junction, and a bit line according to an embodiment of the disclosure.

Still referring to FIG. 11, a plurality of bit lines 300 may be formed on the magnetic tunnel junction 130 to alleviate the problem of a high resistance of buried bit lines. The extension direction of the word line 200 is referred to as a first direction, and the extension direction of the bit line 300 is referred to as a second direction. In this case, a plurality of bit lines 300 extending in the second direction are formed on the magnetic tunnel junction 130, each bit line 300 may be connected to a plurality of magnetic tunnel junctions 130, and the first direction and the second direction may be perpendicular to each other. Then, a current is generated to generate a magnetic field by applying a voltage to the word line 200 and the bit line 300, so that the magnetization direction of the free layer 133 is changed, so as to implement read and write of the magnetoresistive random access memory.

In the above technical solution, a plurality of vertical transistors 110 are formed on the substrate 400, and a plurality of connection pads 120 are formed on a side of the plurality of vertical transistors 110 away from the substrate 400, so that one connection pad 120 is connected to an odd number of vertical transistors 110. One magnetic tunnel junction 130 is formed on one side of each connection pad 120 away from the vertical transistor 110, so that an odd number of vertical transistors 110 are connected to one magnetic tunnel junction 130 through the connection pad 120. The odd number of vertical transistors 110 provide a write current for one magnetic tunnel junction 130, to improve the drive capability of the memory cell. Besides, the material of the channel of the vertical transistor 110 is a monocrystalline semiconductor, which can further improve the drive capability of the memory cell.

Those skilled in the art may easily figure out other implementations of the present disclosure after considering the specification and practicing the invention disclosed herein. The present disclosure is intended to cover any variations, purposes or applicable changes of the present disclosure. Such variations, purposes or applicable changes follow the general principle of the present disclosure and include common knowledge or conventional technical means in the technical field which is not disclosed in the present disclosure. The specification and embodiments are merely considered as illustrative, and the real scope and spirit of the present disclosure are pointed out by the appended claims.

It should be noted that, the present disclosure is not limited to the precise structures described above and shown in the drawings, and can be modified and changed in many ways without departing from the scope of the present disclosure. The scope of the present disclosure is defined only by the appended claims.

The invention claimed is:

1. A semiconductor structure, comprising:
   a plurality of memory cells alternately arranged on a substrate, one of the plurality of memory cells comprising an odd number of vertical transistors, a connection pad connected to one end of each of the odd number of vertical transistors, and a magnetic tunnel junction located on the connection pad; wherein
   a material of a channel of each of the odd number of vertical transistors comprises a monocrystalline semiconductor.

2. The semiconductor structure according to claim 1, wherein
   the monocrystalline semiconductor comprises monocrystalline silicon or monocrystalline germanium.

3. The semiconductor structure according to claim 1, wherein
   the odd number of vertical transistors of the plurality of memory cells form an array structure alternately arranged on the substrate.

4. The semiconductor structure according to claim 3, wherein
   the connection pad is connected to one end of each of three of the odd number of vertical transistors.

5. The semiconductor structure according to claim 3, wherein
   a cross section of the vertical transistor along a direction of a surface of the substrate is a circle, a cross section of the connection pad along the direction of the surface of the substrate is a triangle, and each vertex of the triangle is respectively located at a center of the circular cross section.

6. The semiconductor structure according to claim 5, wherein
   a projection of the magnetic tunnel junction on the substrate is located within a projection of the connection pad on the substrate.

7. The semiconductor structure according to claim 4, wherein the vertical transistors in two adjacent rows of the plurality of memory cells are located in three consecutive rows of the array structure, the three consecutive rows in the array of the vertical transistors are sequentially marked as an $(i-1)^{th}$ row, an $i^{th}$ row, and an $(i+1)^{th}$ row, the two adjacent rows in the memory cell array are sequentially marked as a $(j-1)^{th}$ row and a $j^{th}$ row, the vertical transistors in the $(j-1)^{th}$ row of plurality of memory cells are located in the $(i-1)^{th}$ row and the $i^{th}$ row in the array of the vertical transistors, and the vertical transistors in the $j^{th}$ row of plurality of memory cells are located in the $i^{th}$ row and the $(i+1)^{th}$ row in the array of the vertical transistors.

8. The semiconductor structure according to claim 5, further comprising:

a plurality of word lines arranged at intervals, wherein an extension direction of the word line is the same as a direction of a side of the triangle.

9. The semiconductor structure according to claim 8, wherein the word line comprises a gate electrode portion and a conducting wire portion; and the gate electrode portion surrounds a channel of each of the vertical transistors of the memory cell, and the conducting wire portion connects a plurality of the gate electrode portions.

10. The semiconductor structure according to claim 9, wherein a projection of the gate electrode portion on the surface of the substrate coincides with a projection of the connection pad on the surface of the substrate.

11. The semiconductor structure according to claim 10, wherein the gate electrode portion and the conducting wire portion are formed in a same etching step.

12. The semiconductor structure according to claim 9, wherein a width of a portion of the word line is smaller than a distance between the vertical transistors.

* * * * *